US009985537B2

United States Patent
Shi et al.

(10) Patent No.: US 9,985,537 B2
(45) Date of Patent: May 29, 2018

(54) PRIMARY SENSING OF OUTPUT VOLTAGE FOR AN AC-DC POWER CONVERTER

(71) Applicant: Dialog Semiconductor Inc., Campbell, CA (US)

(72) Inventors: Fuqiang Shi, Los Gatos, CA (US); Pengju Kong, Campbell, CA (US); Hien Huu Bui, San Jose, CA (US); Judy Sha, Cupertino, CA (US); David Nguyen, Santa Clara, CA (US); Duc Doan, San Jose, CA (US)

(73) Assignee: Diaglo Semiconductor Inc., Campbell, CA (US)

( * ) Notice: Subject to any disclaimer, the term of this patent is extended or adjusted under 35 U.S.C. 154(b) by 214 days.

(21) Appl. No.: 14/563,954

(22) Filed: Dec. 8, 2014

(65) Prior Publication Data

US 2015/0160270 A1 Jun. 11, 2015

Related U.S. Application Data

(60) Provisional application No. 61/914,763, filed on Dec. 11, 2013.

(51) Int. Cl.
*H02M 3/335* (2006.01)
*G01R 19/00* (2006.01)

(52) U.S. Cl.
CPC .... *H02M 3/33515* (2013.01); *G01R 19/0084* (2013.01); *H02M 3/33523* (2013.01); *H02M 3/335* (2013.01)

(58) Field of Classification Search
CPC ........ G01R 19/00; G01R 23/02; G01R 25/00; G01R 9/0084; G01R 19/0084; H02M 3/335; H02M 3/33515; H02M 3/33523

(Continued)

(56) References Cited

U.S. PATENT DOCUMENTS 5,138,543 A 8/1992 Harm et al.
5,636,106 A 6/1997 Batarseh et al.
(Continued)

FOREIGN PATENT DOCUMENTS

CN 102427300 A 4/2012
WO WO 2012/151594 A2 11/2012

OTHER PUBLICATIONS

PCT International Search Report and Written Opinion, PCT Application No. PCT/US2014/069630, dated Mar. 24, 2015, 15 pages.

(Continued)

*Primary Examiner* — Fred E Finch, III
*Assistant Examiner* — Lorena Bruner
(74) *Attorney, Agent, or Firm* — Fenwick & West LLP (57) ABSTRACT

A method for estimating an output voltage of a power converter comprises sensing a voltage waveform representative of the output voltage; and detecting a first gap and a second gap. The first gap is between a time when the sensed voltage waveform crosses a first voltage reference and a time when the sensed voltage waveform crosses a second voltage reference at a voltage offset below the first voltage reference. The second gap is between a time when the sensed voltage waveform crosses a third voltage reference and a time when the sensed voltage waveform crosses the second voltage reference, the third voltage referenced at a predetermined voltage above the second voltage reference. Responsive to the first gap exceeding a threshold, a tracking error is computed based on the first gap; and responsive to the first gap not exceeding the threshold, the tracking error is computed based on the second gap.

16 Claims, 5 Drawing Sheets

(58) Field of Classification Search
USPC .................................................. 363/21.13
See application file for complete search history.

(56) References Cited

U.S. PATENT DOCUMENTS

| | | | |
|---|---|---|---|
| 6,956,750 B1 * | 10/2005 | Eason ............... | H02M 3/33523 |
| | | | 363/21.01 |
| 6,990,000 B1 | 1/2006 | Rodriguez et al. | |
| 7,459,893 B2 | 12/2008 | Jacobs | |
| 7,583,519 B2 | 9/2009 | Piper et al. | |
| 7,589,983 B1 * | 9/2009 | Lin ................... | H02M 3/33515 |
| | | | 323/367 |
| 7,777,461 B2 | 8/2010 | Martin et al. | |
| 7,808,802 B2 | 10/2010 | Cai | |
| 2008/0112193 A1 * | 5/2008 | Yan ................... | H02M 3/33515 |
| | | | 363/21.08 |

OTHER PUBLICATIONS

Chinese First Office Action, Chinese Application No. 201480066412.3, dated Dec. 5, 2017, 16 pages.

* cited by examiner

PRIMARY SENSING OF OUTPUT VOLTAGE FOR AN AC-DC POWER CONVERTER

CROSS-REFERENCE TO RELATED APPLICATION

This application claims priority under 35 U.S.C. § 119(e) from U.S. Provisional Patent Application No. 61/914,763, entitled "Primary Sensing of Output Voltage for an AC-DC Power Converter," filed on Dec. 11, 2013, which is incorporated by reference herein in its entirety.

BACKGROUND

The present disclosure relates generally to a switch mode power converter, and more specifically, to a power converter controller operating with variable reference voltages.

A switch mode power converter—commonly used in low power AC-DC power supplies—includes a transformer, a power switch, and a controller. The controller regulates power delivered to a load by controlling actuation of the power switch. The controller typically provides a switch control signal to control a state of the power switch either in an ON or OFF state so as to regulate power delivered to the load based on, for example, pulse width modulation (PWM) or pulse frequency modulation (PFM) control.

SUMMARY

According to some embodiments, a method for estimating an output voltage of a switching power converter comprises sensing a voltage waveform via primary side sensing, the sensed voltage waveform representative of the output voltage. The method further comprises detecting a first gap between a time when the sensed voltage waveform crosses a first voltage reference and a time when the sensed voltage waveform crosses a second voltage reference at a predetermined voltage offset below the first voltage reference. Additionally, the method comprises detecting a second gap between a time when the sensed voltage waveform crosses a third voltage reference and a time when the sensed voltage waveform crosses the second voltage reference, the third voltage referenced at a predetermined voltage above the second voltage reference. Furthermore, the method comprises responsive to the first gap exceeding a threshold, computing a tracking error based on the first gap and responsive to the first gap not exceeding the threshold, computing the tracking error based on the second gap.

In some embodiments, the method further comprises adjusting, the first, second, and third reference voltages based on the tracking error.

In some embodiments, the threshold corresponds to a first predetermined time interval. The method further comprises responsive to the first gap exceeding the threshold, the tracking error is computed based on a difference between the first predetermined time interval and the first gap, the difference scaled by a first scaling constant; and responsive to the first gap not exceeding the threshold, the tracking error is computed based on a difference between a second predetermined time interval and the second gap, the difference scaled by a second scaling constant and the second predetermined time interval being greater than the first predetermined time interval. In some cases the first and second scaling constants are substantially equal; in alternative embodiments, the first and second scaling constants are distinct.

Some embodiments provide a switching power converter comprising a transformer coupled between an input voltage and an output of the switching power converter, the transformer including a primary winding coupled to the input voltage and a secondary winding coupled to the output of the switching power converter. The switching power converter further comprises a switch coupled to the primary winding of the transformer, the switch to control current through the primary winding; and switch controller logic configured to generate a control signal to turn on or turn off the switch based on a feedback voltage, the switch being turned on responsive to the control signal being in a first state and the switch being turned off responsive to the control signal being in a second state. The power converter also comprises a first comparator, a second comparator, a third comparator, and knee tracking logic. The first comparator is configured to a first comparison signal based on a comparison between a sensed voltage waveform and a first reference voltage based on the feedback voltage, the sensed voltage waveform representing an estimate of the output voltage waveform. The second comparator is configured to generate a second comparison signal based on a comparison between the sensed voltage waveform and a second reference voltage, the second reference voltage having an offset above the first reference voltage. The third comparator is configured to generate a third comparison signal based on a comparison between the sensed voltage signal and a knee reference voltage, the knee reference voltage having an offset below the first reference voltage. Knee tracking logic is configured to detect a first gap between a falling edge of the first comparison signal and a falling edge of the third comparison signal, detect a second gap between a falling edge of the second comparison signal and the falling edge of the third comparison signal, generate an error signal based on the first gap when the first gap exceeds a threshold, generate the error signal based on the second gap when the first gap does not exceed the threshold, and adjust the feedback voltage according to reduce the error signal.

BRIEF DESCRIPTION OF DRAWINGS

The teachings of the embodiments of the present invention can be readily understood by considering the following detailed description in conjunction with the accompanying drawings.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

DETAILED DESCRIPTION OF EMBODIMENTS

The Figures (FIG.) and the following description relate to the preferred embodiments of the present invention by way of illustration only. It should be noted that from the following discussion, alternative embodiments of the structures and methods disclosed herein will be readily recognized as viable alternatives that may be employed without departing from the principles of the present disclosure.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the disclosure described herein.

Figure 1:
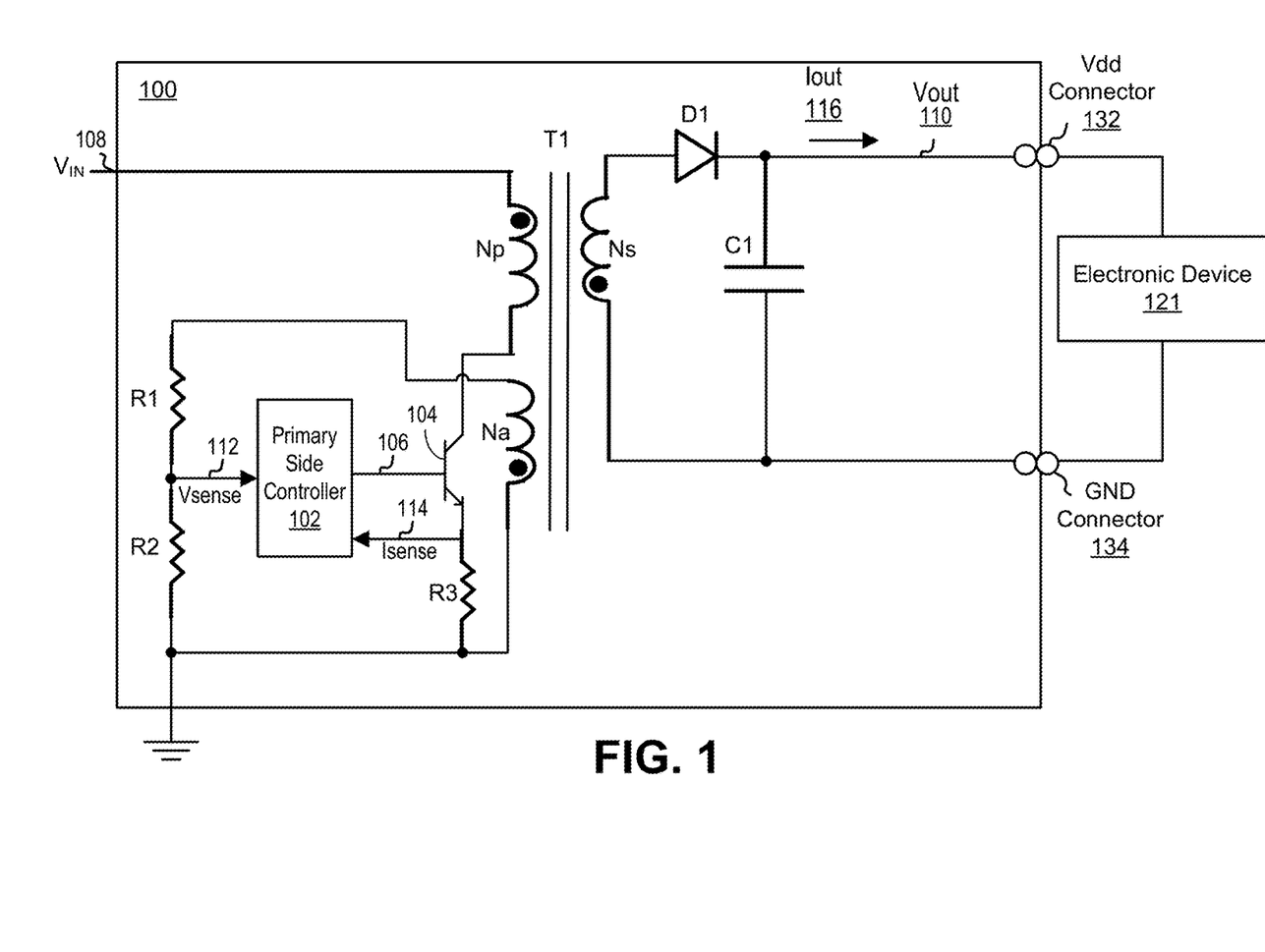
FIG. 1 illustrates an AC to DC flyback switching power supply, according to one embodiment.

FIG. 1 illustrates an exemplary power converter 100 in accordance with one embodiment. FIG. 1 is a circuit diagram illustrating an embodiment of a switching power converter 100 (e.g., a primary-side fly-back switching power converter) providing power to an electronic device 121 via a Vdd connector 132 and a GND connector 134. The switching power converter 100 includes, among other components, a transformer T1 having a primary winding Np, a secondary winding Ns, and an auxiliary winding Na, a switch 104 (e.g., a transistor), a switch controller 102, an output rectifier diode D1, resistors R1, R2, R3, and output filter capacitor C1.

An input voltage ($V_{IN}$) 108, typically a rectified AC voltage, is input to power converter 100. Primary side controller 102 controls the on state and the off state of switch 104 using switch control signal 106 with on-times ($T_{ON}$) and off-times ($T_{OFF}$). Switch control signal 106 may control switching of switch 104 using, for example pulse width modulation (PWM) or pulse frequency modulation (PFM).

When switch 104 is turned on during its on-time, energy is stored in primary side windings Np of transformer T1. The voltage across secondary winding Ns is negative and diode D1 is reverse biased, blocking transfer of energy to electronic device 121. In this state, energy is supplied to electronic device 121 via capacitor C1. When switch 104 is turned off, the energy stored in primary winding Np of transformer T1 is released to secondary winding Ns of transformer T1. Diode D1 becomes forward biased enabling transfer of energy stored in transformer T1 to electronic device 121 and re-charging capacitor C1.

Resistors R1 and R2 form a voltage divider coupled in series with auxiliary winding Na of transformer T1, and produce sensed voltage ($V_{SENSE}$) 112, which can be used to estimate the output voltage ($V_{OUT}$) 110, as will be described below. Resistor R3 is coupled in series with switch 104 to produce a voltage ($I_{SENSE}$) 114 which can be used in conjunction with $V_{SENSE}$ to estimate the output current $I_{OUT}$ 116 through electronic device 121.

In normal operation, controller 102 monitors $V_{SENSE}$ 112 and/or $I_{SENSE}$ 114 and controls switching of switch 104 to maintain a regulated output. For example, in a constant voltage mode (CVM), controller 102 controls switching of switch 104 to maintain $V_{OUT}$ 110 substantially near a desired regulation voltage $V_{REF}$ (for example, within an allowable error range). In a constant current mode (CCM), controller 102 controls switching of switch 104 to maintain $I_{OUT}$ 116 substantially near a desired regulation current $I_{REF}$ (for example, within an allowable error range). In alternative embodiments, controller 102 may perform only voltage regulation (without enabling a current regulation mode) and may therefore omit the current sense $I_{SENSE}$ feedback signal.

In some embodiments, controller 102 receives the voltage feedback signal $V_{SENSE}$ 112 and the current feedback signal $I_{SENSE}$ 114 and generates a switch control signal 106 that is provided to the power switch 104. The switch control signal 106 controls the on/off states of switch 104. In general, controller 102 can implement any number of control schemes suitable for switch-mode power converters 100, such as pulse-width-modulation (PWM) or pulse-frequency-modulation (PFM), and/or their combinations. In one embodiment, controller 102 outputs a control signal 106 that causes the ON time (or duty cycle) of power switch 104 to increase, during a certain switching cycle, in order to increase power delivery to the load during that switching cycle, or to decrease in order to decrease power delivery to the load during that switching cycle.

Primary side auxiliary winding Na of power transformer allows for a low voltage $V_{SENSE}$ 112 to be generated because the voltage can be scaled down based on the turn ratio of the secondary winding Ns and auxiliary winding Na. However, in an alternative embodiment, auxiliary winding Na may be omitted, and $V_{SENSE}$ 112 may instead be detected by directly monitoring the voltage across primary winding Np.

Figure 2A:
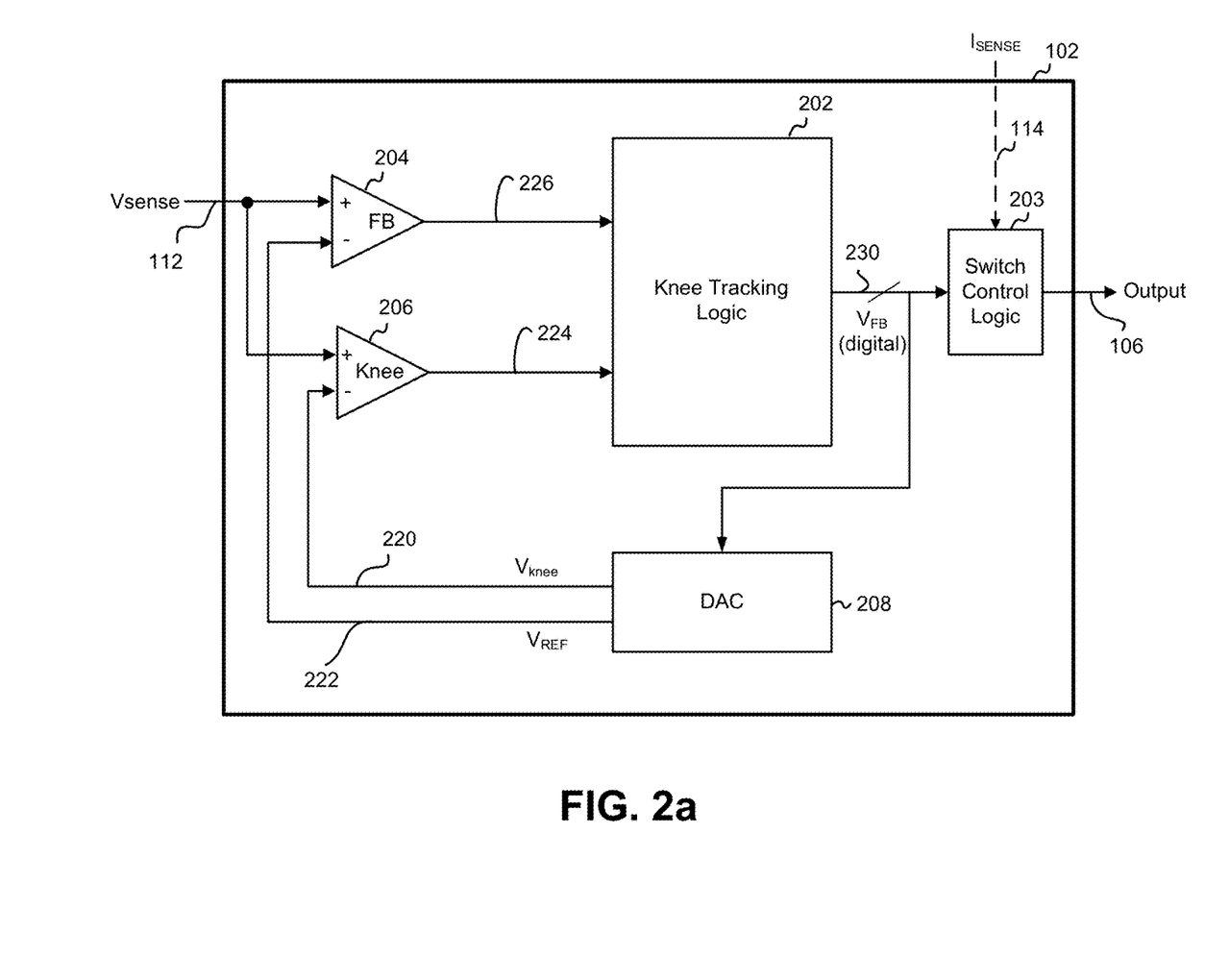
FIG. 2a includes a block diagram of a controller of the AC to DC flyback switching power supply illustrating a knee point tracking logic that facilitates output voltage regulation, according to one embodiment.
Figure 2B:
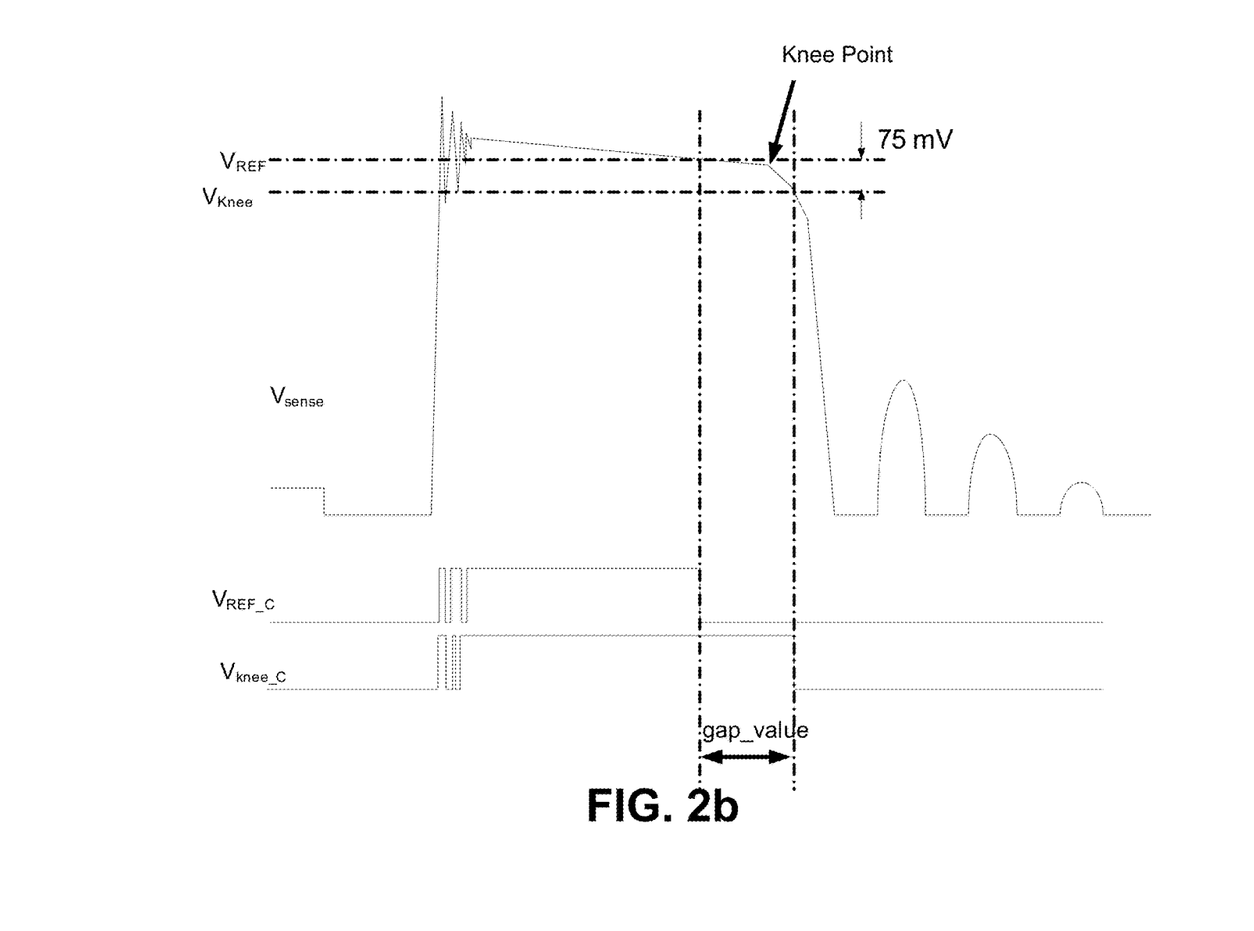
FIG. 2b includes voltage-time waveforms illustrating various operational principals of the knee point tracking logic of FIG. 2a, according to one embodiment.
Figure 3A:
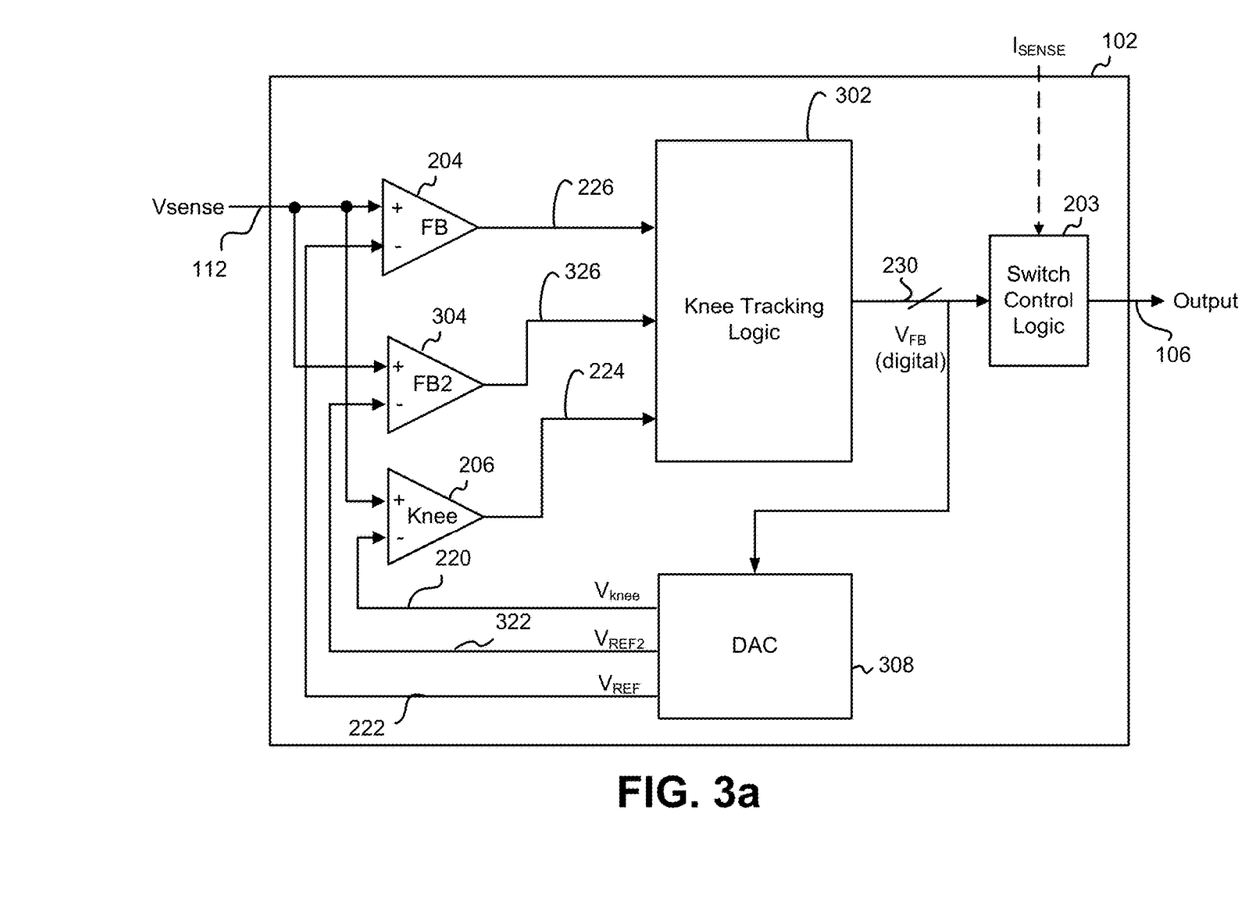
FIG. 3a illustrates a block diagram of a controller of the AC to DC flyback switching power supply illustrating a modified knee point tracking logic that facilitates output voltage regulation under rapidly varying load conditions, according to one embodiment.
Figure 3B:
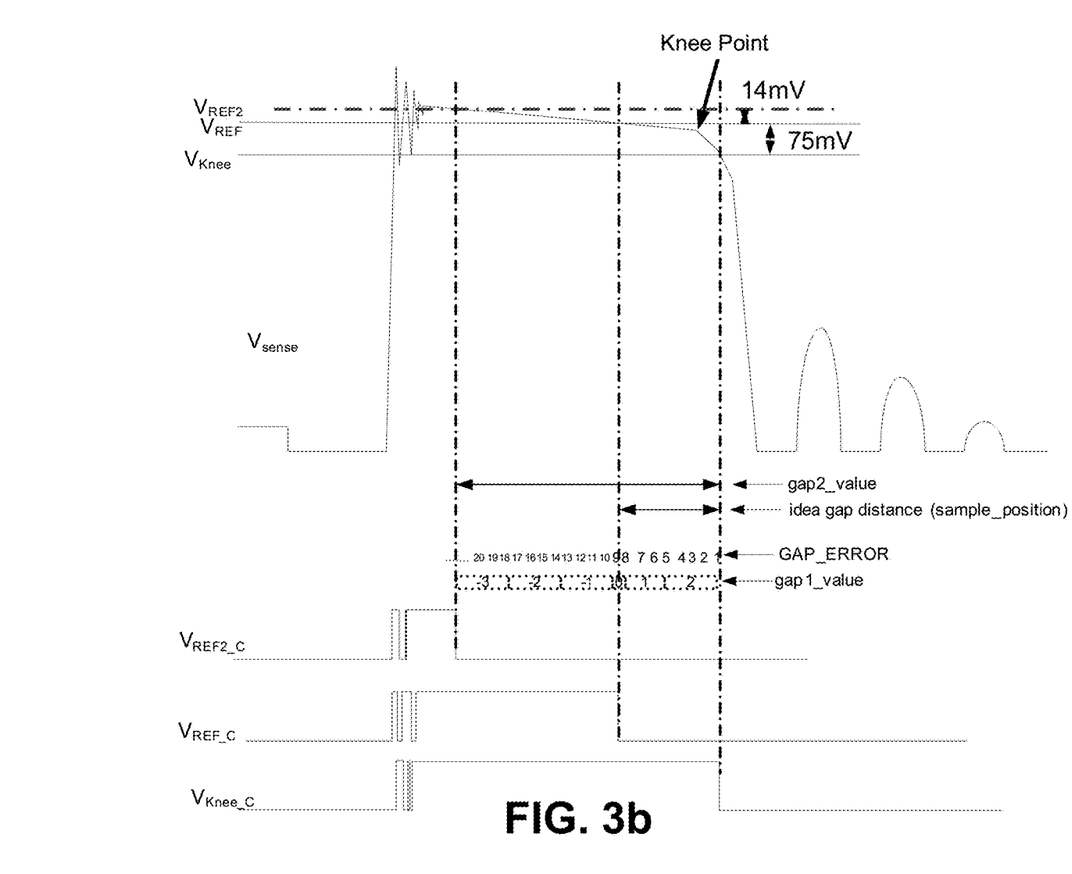
FIG. 3b includes voltage-time waveforms illustrating various operational principals of the modified knee point tracking logic of FIG. 3a, according to one embodiment.

The sensed voltage $V_{SENSE}$ 112 varies over a given switching cycle in a more or less deterministic waveform pattern (see, for example the $V_{SENSE}$ waveforms illustrated in FIG. 2b and FIG. 3b). For accurate estimation of the output voltage via the $V_{SENSE}$ waveform, during a given switching cycle, it is desirable to determine a voltage value of the $V_{SENSE}$ waveform at a predefined time point located at or close to a "knee" point (marked in FIGS. 2b and 3b) of the $V_{SENSE}$ waveform. As used herein, the "knee" point represents a time point in the switching cycle when the secondary side current through diode D1 reaches zero. The voltage at the knee point is referred to as the "knee voltage." The $V_{SENSE}$ waveform knee point voltage has a fixed relationship to the output voltage:

$$Vknee/Vout=(Na/Ns)*R2/(R1+R2)$$

where Na/Ns is the transformer auxiliary winding to secondary winding turns ratio and R2/(R1+R2) is the resister divide down ratio. By consistently detecting a voltage of the $V_{SENSE}$ waveform at the predefined time point located at the specified time interval before the knee point, the output voltage can be accurately and consistently estimated for the purposed of feedback regulation. In a voltage regulation mode, controller 102 then generates an error signal representative of a difference between a target voltage value at the predefined time point and the detected feedback voltage at the predefined time point and adjusts switching to reduce (e.g., minimize or null) the error.

FIG. 2a includes a block diagram of a controller of the AC to DC flyback switching power supply, according to one embodiment. Controller 102 comprises knee tracking logic 202, switch control logic 203, dual output digital-to-analog converter (DAC) 208, feedback voltage comparator 204, and knee voltage comparator 206. The feedback voltage comparator 204 compares the $V_{SENSE}$ signal with a feedback reference signal $V_{REF}$ 222 to generate a feedback voltage comparator signal 226 indicating whether or not $V_{SENSE}$ exceeds $V_{REF}$ 222 (see, for example, digital comparison signal $V_{REF\_C}$ shown in FIG. 2b). Knee voltage comparator 206 similarly compares the $V_{SENSE}$ signal with a second feedback reference signal (knee voltage comparator signal $V_{knee}$ 220) to generate a knee voltage comparator signal 224 indicating whether or not $V_{SENSE}$ exceeds $V_{knee}$ 220 (see, for example, digital comparison signal $V_{Knee\_C}$ shown in FIG. 2b). Knee tracking logic 202 generates a feedback voltage $V_{FB}$ 230 that adjusts based on a time difference between a falling edge of comparison signal 226 and a falling edge of comparison signal 224. Dual output DAC 208 receives the digital signal $V_{FB}$ 230 from knee voltage tracking logic 202 and generates the reference voltage $V_{REF}$ 222 and the knee reference voltage $V_{knee}$ 220. In one embodiment, $V_{knee}$ 220 is set at a fixed offset below $V_{REF}$ 222. For example, in one embodiment, $V_{knee} = V_{REF} - V_{offset}$ where $V_{offset}$ is fixed. In one embodiment, the predetermined fixed voltage $V_{offset}$ is set to be at least equal to or greater than the forward voltage drop in the diode D1 during the predefined time interval prior to $V_{SENSE}$ 112 reaching $V_{knee}$ as described in U.S. Pat. No. 6,956,750 to Eason et al.

Switch control logic 203 controls a regulation level by generating switch control signal 106 provided to the switch to regulate output current and/or voltage based $V_{FB}$ 230 received from knee tracking logic 202. For example, in one embodiment, switch control logic 203 compares the feedback voltage ($V_{FB}$ 230) to a fixed reference voltage (corresponding to a state of target or desired regulation) and adjusts switching to reduce an error between the feedback voltage and the fixed reference voltage. In a current regulation mode, switch control logic 203 generates switch control signal 106 to provide substantially constant current control based on the feedback voltage and the current sense signal $I_{SENSE}$. In embodiments that do not enable current regulation, the $I_{SENSE}$ input may be omitted. In an alternative embodiment, switch control logic 203 may perform feedback regulation based on one or more different signals instead of, or in addition to, $V_{FB}$ 230 such as, for example, the signals $V_{knee}$, $V_{REF2}$, or $V_{REF}$ discussed below, or digital representations of these signals.

FIG. 2b provides waveforms illustrating the operation of the circuit of FIG. 2a. In order to accurately and consistently determine the feedback voltage used by switch control logic 203 given the variation of $V_{SENSE}$ 112 over the sampling period, knee tracking logic 202 detects voltages at two or more predefined points on the $V_{SENSE}$ waveform curve—a first detection point at a predefined voltage below the knee voltage defined above (shown in FIG. 2b) and one or more predefined time points located at one or more specified time intervals before the first detection point at the predefined voltage below the knee voltage. The predefined points can be detected consistently in each switching cycle because the average slope of the $V_{SENSE}$ waveform over a given period around the knee point is well-defined and typically constant for a given flyback converter, and can therefore be computed based on various circuit parameters of the flyback converter.

In a simple implementation, sampling circuits may be used to sample the $V_{SENSE}$ waveform and then determine the voltages at the predefined desired points (including the knee point) based on the samples. However, to reduce cost and physical size of the tracking logic, it is desirable to detect these voltages without using a sampling circuit. FIG. 2b illustrates waveforms showing a technique for detecting the knee voltage without using a sampling circuit. In this technique, a pair of varying reference voltages (e.g. a reference voltage $V_{REF}$ and a knee reference voltage $V_{knee}$ in FIG. 2b) are varied to track the $V_{SENSE}$ 112 voltage as $V_{SENSE}$ as it shift up or down due to varying load conditions. Although the notation "$V_{knee}$" and "knee reference voltage" is used throughout the disclosure, this voltage reference does not necessarily correspond to the knee point under ideal tracking conditions, and instead generally corresponds to a voltage at a fixed offset below the knee voltage. For example, under ideal tracking conditions, $V_{REF}$ and $V_{knee}$ are controlled such that $V_{SENSE}$ 112 will intersect $V_{knee}$ at a predefined voltage below the knee of $V_{SENSE}$ for a given clock cycle. Furthermore, under ideal tracking conditions, $V_{SENSE}$ will intersect $V_{REF}$ near or at the knee at a fixed time interval prior to $V_{SENSE}$ 112 intersecting $V_{knee}$.

In one embodiment, a feedback configuration is used for tracking. In this embodiment, controller 102 measures a duration of time (referred to herein as GAP or a gap value) over which the $V_{SENSE}$ 112 voltage drops from a reference voltage ($V_{REF}$ 222) to a knee reference voltage ($V_{knee}$ 220) where $V_{knee}$ is set at a fixed voltage offset below $V_{REF}$. The gap value can be measured, for example, by using a counter that counts a number of clock cycles between the respective reference voltage crossings. The voltage offset is set based on the expected voltage drop of $V_{SENSE}$ 112 from $V_{REF}$ to $V_{knee}$ over the predefined time interval when $V_{REF}$ 222 is at or near the knee voltage (e.g., under ideal tracking). For a given predefined time interval, the voltage offset between $V_{REF}$ 222 and $V_{knee}$ 220 can be calculated based on fixed circuit parameters. For example, in the example of FIG. 2b, an offset of 75 mV is used.

Once this gap is determined, controller 102 determines a measure of error (GAP_ERROR) by subtracting the determined gap from the predefined time interval (Sample_position), based on the following equation:

$$\text{GAP\_ERROR} = (\text{Sample\_position} - \text{gap\_value} / \text{scaling\_factor} \quad (1)$$

where the scaling_factor is a scaling factor discussed in further detail below. A zero GAP_ERROR value (resulting from gap_value being equal to Sample_position) signifies accurate knee point tracking. In other words, at a zero value of GAP_ERROR, the knee reference voltage ($V_{knee}$ 220) has a fixed voltage offset below a voltage corresponding to the knee point on the $V_{SENSE}$ curve for the given load conditions. Consequently, the reference voltage ($V_{REF}$ 222) also precisely equals to a voltage value measured at the predefined time interval prior to $V_{SENSE}$ 112 crossing $V_{knee}$ 220.

A non-zero GAP_ERROR value signifies loss of ideal knee point tracking due to, for example, a change in the output voltage. Detecting a positive GAP_ERROR (resulting from gap_value falling below Sample_position), indicates that the reference voltages $V_{REF}$, $V_{knee}$ are too low (e.g., lower than corresponding values of $V_{REF}$ 222 and $V_{knee}$ 220 that would result from ideal tracking under the same load conditions). Under this condition, controller 102 (knee tracking logic 202), in the next switching cycle, raises both the variable reference voltage ($V_{REF}$ 222) and the variable knee voltage ($V_{knee}$ 220) by an appropriate amount based on the gap error to restore desired tracking conditions. On the other hand, if GAP_ERROR is negative (resulting from gap_value exceeding Sample_position), this indicates that the reference voltages $V_{REF}$ 222, $V_{knee}$ 220 are too high (e.g., higher than corresponding values of $V_{REF}$ 222 and $V_{knee}$ 220 that would result from ideal tracking under the same load conditions). Under this condition, controller 102 (knee tracking logic 202), in the next switching cycle, decreases both the variable reference voltage ($V_{REF}$ 222)

and the variable knee voltage ($V_{knee}$ 220) by an appropriate amount based on the gap error to restore desired tracking conditions.

The methods of tracking the $V_{SENSE}$ waveform using variable reference and knee voltages described above involve conversion of timing parameters (e.g., the timing difference between the falling edges of $V_{REF\_C}$ and $V_{knee\_C}$; corresponding to a time interval over which $V_{SENSE}$ 112 drops from $V_{REF}$ 222 to $V_{knee}$ 220) to voltage parameters (e.g., the voltage difference to adjust $V_{FB}$ 230 in a given clock cycle). A scaling factor of 1 in equation (1) assumes that one clock cycle of GAP_ERROR corresponds to 1 LSB of voltage difference. In order to perform a more accurate conversion between the timing parameters and the voltage parameters, a slope of the $V_{SENSE}$ waveform is computed. The $V_{SENSE}$ waveform slope is dependent on factors such as secondary diode Rds_on resistance, output capacitance, ESR resistance, and the like. Thus, a scaling factor (e.g., scale_factor=3, 4, 5, or any suitable value) representative of the $V_{SENSE}$ waveform slope is used to perform a more accurate conversion of the gap_value to the GAP_ERROR.

$V_{FB}$ 230 is adjusted between consecutive switching cycles based on the following equation:

$$V_{FB}[n] = V_{FB}[n-1] + \text{GAP\_ERROR} \quad (2)$$

Although, knee tracking logic 202 of FIG. 2a causes reference voltage $V_{REF}$ 222 to vary when load conditions vary (e.g., by adjusting $V_{FB}$ based on the computed GAP_ERROR via equation 2), knee tracking logic 202 is limited in its ability to vary the reference voltage $V_{REF}$ 222 faster than a specified tracking rate. In other words, if the load conditions vary more rapidly than a specified rate of load change (e.g., if the output voltage rises faster than at a specified rate of voltage rise), then knee tracking logic 202 of FIG. 2a is unable to vary $V_{REF}$ 222 rapidly enough to track the rapidly increasing output voltage (and consequently, rapidly increasing $V_{SENSE}$ 112). This is because of an upper limit on GAP_ERROR (e.g., the value of the predefined time interval or Sample_position; the desired or target $V_{SENSE}$ fall time) resulting from a lower limit of the value of GAP (corresponding to gap_value=0) occurring if the $V_{SENSE}$ voltage 112 rises to a value that causes the interval between instances at which values of $V_{SENSE}$ 112 drop from $V_{REF}$ 222 to $V_{knee}$ 220 in substantially zero time, at a rate greater than a rate at which the tracking logic can track the drift in the $V_{SENSE}$ waveform; in other words, the $V_{SENSE}$ 112 voltage rises faster than conventional knee tracking logic 202 is able to vary $V_{REF}$ 222 and $V_{knee}$ 220 to maintain desired tracking.

In order to maintain a variable reference voltage and variable knee voltage that appropriately tracks the output voltage during rapidly changing variable load conditions, or load conditions that vary faster than at a specified rate of load change, some embodiments of the present disclosure include a modified knee tracking logic 302 and a secondary reference voltage $V_{REF2}$ 322 (described further with reference to FIG. 3a below) that enable a greater measurement range of the digital gap error (GAP_ERROR), thereby facilitating effective tracking of rapidly varying load conditions.

As an illustration of the fast tracking limitation of the knee tracking logic of FIG. 2a, consider, for example, values of Sample_position=8 and scale_factor=4. Then, based on equation (1), GAP_ERROR has an upper bound of 2 (corresponding to a minimum possible value of gap_value=0). As a result, the maximum value of change that can be made to $V_{FB}$ 230 (based on equation 2) between consecutive switching cycles n-1 to n would be 2 (corresponding to the maximum value of GAP_ERROR for this example). This in turn limits the magnitude of change that can be made to $V_{FB}$ 230 between consecutive switching cycles, thereby limiting an extent to which $V_{REF}$ 222 and $V_{knee}$ 220 can be varied to track $V_{SENSE}$ 112 when output load and the output voltage change at a rate greater than a specified rate (typically from heavy/full load conditions to light/no load; increasing output voltage or current values).

FIG. 3a illustrates a block diagram of a controller of the AC to DC flyback switching power supply illustrating a modified knee point tracking logic to facilitate effective tracking of $V_{SENSE}$ 112 under rapidly varying load conditions, according to one embodiment. Switch controller 102 shown in FIG. 3a also includes, among other components, knee tracking logic 302, switch control logic 203, triple output digital-to-analog converter (DAC) 308, feedback voltage comparator 204, and knee voltage comparator 206. Additionally, switch controller 102 includes secondary feedback voltage comparator 304.

Knee tracking logic 302, switch control logic 203, digital-to-analog converter (DAC) 308, feedback voltage comparator 204, and knee voltage comparator 206 described with reference to FIG. 3a may share one or more attributes, respectively, of knee tracking logic 202, switch control logic 203, digital-to-analog converter (DAC) 208, feedback voltage comparator 204, and knee voltage comparator 206 described with reference to FIG. 2a herein. For brevity, these details are not repeated here. Secondary feedback voltage comparator 304 compares $V_{SENSE}$ 112 sensed in a given switching cycle to the variable reference voltage $V_{REF2}$ 322. In response, feedback comparator 204 generates a secondary feedback comparator signal 326 (e.g., $V_{REF2\_C}$ shown in FIG. 3b). In addition to the feedback voltage comparator signal 226 and the knee voltage comparator signal 224, modified knee tracking logic 302 also uses the secondary feedback voltage comparator signal 326 to generate a digital feedback signal $V_{FB}$ 230 representing an estimated output voltage in the prior switching cycle. Triple output DAC 308 receives the digital signal $V_{FB}$ 230 from modified knee tracking logic 302 and generates the reference voltage $V_{REF2}$ 322, in addition to the reference voltage $V_{REF}$ 222 and the knee reference voltage $V_{knee}$ 220, described previously with reference to FIG. 2a.

The secondary reference voltage $V_{REF2}$ 322 is defined (in addition to $V_{REF}$)—at a specified voltage separation from the variable reference voltage $V_{REF}$ 222 (e.g., 14 mV as illustrated in the voltage time traces of FIG. 3b) and greater in voltage value compared to $V_{REF}$ 222. In other words, the secondary reference voltage $V_{REF2}$ 322 is offset from the knee reference voltage $V_{knee}$ 220 at an additional voltage offset (e.g., 4 LSB voltage difference) above the voltage offset provided by the reference voltage $V_{REF}$ 112. Knee tracking logic 302 measures two different voltage drop durations (or gap values) based on the $V_{SENSE}$ waveform—a drop of the $V_{SENSE}$ waveform from $V_{REF}$ to $V_{knee}$ (gap1_value), and from $V_{REF2}$ to $V_{knee}$ (gap2_value).

The two feedback voltage comparators each provide a comparison between $V_{SENSE}$ 112 and a corresponding variable reference voltage that is used by modified knee tracking logic 302 to compute corresponding gap timing values (gap1_value corresponding to $V_{REF}$, and gap2_value corresponding to $V_{REF2}$, as shown in FIG. 3b). Modified knee tracking logic 302 then uses each of the two gap timing values to compute a corresponding digital gap error, based on the following equations:

$$\text{GAP\_ERROR1} = (\text{Sample\_position} - \text{gap1\_value}) / \text{Scale\_factor} \quad (4)$$

$$\text{GAP\_ERROR2} = (\text{Sample\_position2} - \text{gap2\_value}) / \text{Scale\_factor} \quad (5)$$

As explained with reference to Sample_position, Sample_position2 corresponds to a target $V_{SENSE}$ fall time between $V_{REF2}$ and $V_{knee}$ under conditions of ideal tracking. When ideal tracking conditions are met, (i.e., GAP_ERROR1=0 and GAP_ERROR2=0), the sampling positions are given as follows:

Sample_position=gap1_value

Sample_position2=gap2_value

Based on the equations above, in some embodiments, Sample_position2 can be computed as:

$$\text{Sample\_position2} = (\text{gap2\_value} - \text{gap1\_value}) + \text{Sample\_position} \quad (6)$$

Referring to equation (6), and as illustrated in FIG. 3b, since $V_{REF2}$ 322 is selected, by design, to be of greater voltage magnitude than $V_{REF}$ 222, for the monotonically falling portion of the $V_{SENSE}$ waveform, $V_{SENSE}$ 112 fall time between $V_{REF2}$ 322 and $V_{knee}$ 220 (measured as gap2_value) is greater than the $V_{SENSE}$ 112 fall time between $V_{REF}$ 222 and $V_{knee}$ 220 (measured as gap1_value). Thus, by design, gap2_value exceeds gap1_value and Sample_position2 exceeds Sample_position. This allows for GAP_ERROR2 to have a greater dynamic range (or upper bound) than GAP_ERROR1.

To illustrate the greater tracking dynamic range provided by the addition of secondary feedback voltage comparator 326, consider an example where a voltage offset between $V_{REF2}$ to $V_{REF}$ corresponds to 4 LSB (least significant bits) of voltage. Then, (gap2_value-gap1_value)/scale_factor=4

Additionally, if Sample_position=8 and scale_factor=4, then

Sample_position2=(gap2_value-gap1_value+ Sample_ position)=24

Thus, in the above example, using equation (5), GAP_ERROR2 has an upper bound of 6, as opposed to GAP_ERROR1, which, as explained above with reference to FIG. 2a (for the same values of scale_factor=4 and sample_position=8), is limited to an upper bound of value 2. Thus, GAP_ERROR2 provides a greater dynamic range over which $V_{FB}$ 230 can be modified between consecutive switching cycles, as compared to GAP_ERROR1, resulting in better tracking efficacy in rapidly varying load conditions.

In some embodiments, Sample_position2 is calculated during the switching cycles where gap1_value is close to Sample_position. The Sample_position2 is then used for other switching cycles.

In some embodiments, loads particularly change from heavy to light conditions—causing output load current or voltage to change from low to high values—at a rapid rate. In such embodiments, the knee tracking logic using only $V_{REF}$ (such as the one described with reference to FIGS. 2a-2b) provides limited tracking speed. Accordingly, some embodiments, such as those described with reference to FIG. 3a provide a high dynamic range (or fast tracking speed) for tracking the reflected output voltage $V_{SENSE}$ when output voltage rapidly rises from low to high voltage values. In such embodiments, GAP_ERROR2 (which provides greater tracking range) is used to compute $V_{FB}$ in order to track rapidly rising output voltage. On the other hand, GAP_ERROR1 (which provides the lower tracking range) may be used to compute $V_{FB}$ to track output load voltage that gradually fall from high to low voltage values, as described by the conditional relationships below.

if (gap1_value>Sample_position) then
   GAP_ERROR=(Sample_position-gap1_value)/scale_factor
else
   GAP_ERROR=(Sample_position2-gap2_value)/scale_factor In some embodiments, the scaling factor (scale_factor) is dynamically calibrated, e.g., during active use or operation. For a voltage offset between $V_{REF2}$ to $V_{REF}$ corresponding to 4 LSB of voltage, if gap1_value is equal to or substantially equal to Sample_position, then:

scale_factor=(gap2_value-gap1_value)/4

The scale factor can then be dynamically calibrated, thereby facilitating tracking of the $V_{SENSE}$ waveform slope even as it varies based on different designs, thus improving GAP detection accuracy.

Although the GAP time to voltage offset relationship is described here as following a linear relationship, in practice, the gap error adjustment at the DAC voltage may represented and be performed via various non-linear characteristics. For example, the positive and negative gap error for $V_{FB}$ adjustment may have different gains (e.g., scale factors), the scale factor may be modeled as having a non-linear relationship to the gap error value, and the like.

Alternatively, or in addition, in some embodiments, a digital filter may be used to change the gain (e.g., scale_factor) based on the rate of change (e.g., frequency) of the gap error; this could be useful in tracking fast changes and gradually refining the error term in time.

In another embodiment, the voltage offsets between $V_{knee}$ and $V_{REF}$ and between $V_{knee}$ and $V_{REF2}$ are not necessarily fixed, and instead may be adjusted based on varying conditions of the flyback converter.

To further facilitate fast tracking of the knee voltage point, one or more comparators with fixed threshold can be included in controller 102 shown in FIG. 3a. The comparator helps to determine if a knee point of the $V_{SENSE}$ waveform is above certain fixed threshold, in which case, $V_{FB}$ 230 may be directly set to the voltage level corresponding to the comparator threshold.

In some embodiments, a gap accelerator is implemented to speed up the tracking, for example, if a gap error is greater than a specified upper bound, then the gap error is further increased. Conversely, if the gap error is determined to be below a specified lower bound, then the gap error is further decreased. In other words, in some embodiments, the gap accelerator is configured to modify the generated error signal by increasing a magnitude of the error signal responsive to the magnitude of the generated error signal being greater than a first threshold and by decreasing a magnitude of the error signal responsive to the magnitude of the generated error signal being lower than a second threshold, the second threshold lower than the first threshold. The gap accelerator generates a feedback signal ($V_{FB}$ 230) based on the modified error signal, adjusts, based on the feedback signal, the first reference voltage, the second reference voltage, and the knee reference voltage, and uses the feedback signal to regulate the output voltage of the switching power converter.

FIG. 3b illustrates voltage-time waveforms illustrating some operational principals of the modified knee voltage tracking logic of FIG. 3a, according to one embodiment.

FIG. 3b includes waveforms of the sensed output voltage $V_{SENSE}$ 112 of the power converter sensed in a certain switching cycle, in a power converter of FIG. 3a. Also shown in FIG. 3b are voltage levels corresponding to the variable reference voltage ($V_{REF}$ 222), secondary variable reference voltage ($V_{REF2}$ 322, at a fixed offset, e.g. 14 mV, above $V_{REF}$), and variable knee reference voltage ($V_{knee}$ 220, at a fixed offset, e.g. 75 mV, below $V_{REF}$) annotated relative to the sensed output voltage $V_{SENSE}$ 112. In addition to the $V_{SENSE}$ voltage waveform, $V_{REF}$ 222 and $V_{knee}$ 220 voltage levels, and $V_{REF\_C}$ and $V_{knee\_C}$ comparator signals described with reference to FIGS. 2a-2b, FIG. 3b also illustrates the secondary reference voltage $V_{REF2}$ and corresponding feedback comparator signal $V_{REF2\_C}$ and corresponding gap value (gap2_value) and gap error described with reference to FIG. 3a.

Upon reading this disclosure, those of skill in the art will appreciate still additional alternative embodiments through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope described herein.

What is claimed is:

1. A switching power converter comprising:
    a transformer coupled between an input voltage and an output of the switching power converter, the transformer including a primary winding coupled to the input voltage and a secondary winding coupled to the output of the switching power converter;
    a switch coupled to the primary winding of the transformer, the switch to control current through the primary winding;
    switch controller logic configured to generate a control signal to turn on or turn off the switch based on a feedback voltage, the switch being turned on responsive to the control signal being in a first state and the switch being turned off responsive to the control signal being in a second state;
    a first comparator to generate a first comparison signal based on a comparison between a sensed voltage waveform and a first reference voltage based on the feedback voltage, the sensed voltage waveform representing an estimate of the output voltage waveform;
    a second comparator to generate a second comparison signal based on a comparison between the sensed voltage waveform and a second reference voltage, the second reference voltage having an offset above the first reference voltage;
    a third comparator to generate a third comparison signal based on a comparison between the sensed voltage signal and a knee reference voltage, the knee reference voltage having an offset below the first reference voltage; and
    knee tracking logic to detect a first gap between a falling edge of the first comparison signal and a falling edge of the third comparison signal, detect a second gap between a falling edge of the second comparison signal and the falling edge of the third comparison signal, generate an error signal based on the first gap when the first gap exceeds a threshold, generate the error signal based on the second gap when the first gap does not exceed the threshold, and adjust the feedback voltage to reduce the error signal.

2. The switching power converter of claim 1, wherein the knee tracking logic comprises:
    counter logic to determine the first gap based on a first count of clock cycles of a clock signal between the falling edge of the first comparison signal and the falling edge of the third comparison signal, and to determine the second gap based on a second count of clock cycles of the clock signal between the falling edge of the second comparison signal and the falling edge of the third comparison signal.

3. The switching power converter of claim 1, further comprising gap accelerator logic configured to:
    modify the generated error signal by:
        increasing a magnitude of the error signal responsive to the magnitude of the generated error signal being greater than a first threshold; and
        decreasing a magnitude of the error signal responsive to the magnitude of the generated error signal being lower than a second threshold, the second threshold lower than the first threshold;
    generate a feedback signal based on the modified error signal;
    adjust, based on the feedback signal, the first reference voltage, the second reference voltage, and the knee reference voltage; and
    using the feedback signal to regulate the output voltage of the switching power converter.

4. The switching power converter of claim 1, further comprising a digital filter to determine a rate of change of the error signal between consecutive switching cycles, wherein the knee tracking logic is further configured to adjust the generated error signal based on the determined rate of change.

5. The switching power converter of claim 1, further comprising:
    a digital-to-analog converter to generate the first reference voltage, the second reference voltage, and the knee reference voltage based on the feedback voltage.

6. A method for operating a switching power converter having a transformer coupled between an input voltage and an output of the switching power converter, the transformer including a primary winding coupled to the input voltage and a secondary winding coupled to the output of the switching power converter, the switching power converter further comprising a switch coupled to the primary winding of the transformer to control current through the primary winding, the method comprising:
    generating, by switch controller logic based on a feedback signal, a control signal to turn on the switch responsive to the control signal being a first state and to turn off the switch responsive to the control signal being in a second state;
    sensing, using primary-side sensing, a sensed voltage waveform representing an estimate of the output voltage waveform;
    generating, by a first comparator, a first comparison signal based on a comparison between a sensed voltage waveform and a first reference voltage derived from the feedback voltage;
    generating, by a second comparator, a second comparison signal based on a comparison between the sensed voltage waveform and a second reference voltage having an offset above the first reference voltage;

generating, by a third comparator, a third comparison signal based on a comparison between the sensed voltage signal and a knee reference voltage having an offset below the first reference voltage; and detecting, by knee tracking logic, a first gap between a falling edge of the first comparison signal and a falling edge of the third comparison signal;

detect, by the knee tracking logic, a second gap between a falling edge of the second comparison signal and the falling edge of the third comparison signal;

generating, by the knee tracking logic, an error signal based on the first gap when the first gap exceeds a threshold, generating, by the knee tracking logic, the error signal based on the second gap when the first gap does not exceed the threshold; and adjusting, by the knee tracking logic, the feedback voltage to reduce the error signal.

7. The method of claim 6, wherein determining the first gap comprises:

counting, by counter logic, a first count of clock cycles of a clock signal between the falling edge of the first comparison signal and the falling edge of the third comparison signal.

8. The method of claim 6, wherein determining the second gap comprises:

counting, by the counter logic, a second count of clock cycles of the clock signal between the falling edge of the second comparison signal and the falling edge of the third comparison signal.

9. The method of claim 6, wherein generating the error signal based on the second gap signal comprises:

generating an unmodified error signal based on the second gap signal;

increasing the unmodified error signal to generate the error signal responsive to a magnitude of the unmodified error signal being greater than a first threshold;

decreasing the unmodified error signal to generate the error signal responsive to the magnitude of the unmodified error signal being less than a second threshold lower than the first threshold.

10. The method of claim 6, further comprising:

determining, by a digital filter, a rate of change of the error signal between consecutive switching cycles, and adjusting the error signal based on the determined rate of change.

11. The method of claim 6, further comprising:

generating, by a digital-to-analog converter, the first reference voltage, the second reference voltage, and the knee reference voltage based on the feedback voltage.

12. A controller for a switching power converter for controlling switching of a switch, the controller comprising:

switch controller logic configured to generate a control signal to turn on or turn off the switch based on a feedback voltage, the switch being turned on responsive to the control signal being in a first state and the switch being turned off responsive to the control signal being in a second state;

a first comparator to generate a first comparison signal based on a comparison between a sensed voltage waveform and a first reference voltage based on the feedback voltage, the sensed voltage waveform representing an estimate of the output voltage waveform;

a second comparator to generate a second comparison signal based on a comparison between the sensed voltage waveform and a second reference voltage, the second reference voltage having an offset above the first reference voltage;

a third comparator to generate a third comparison signal based on a comparison between the sensed voltage signal and a knee reference voltage, the knee reference voltage having an offset below the first reference voltage; and knee tracking logic to detect a first gap between a falling edge of the first comparison signal and a falling edge of the third comparison signal, detect a second gap between a falling edge of the second comparison signal and the falling edge of the third comparison signal, generate an error signal based on the first gap when the first gap exceeds a threshold, generate the error signal based on the second gap when the first gap does not exceed the threshold, and adjust the feedback voltage to reduce the error signal.

13. The controller of claim 12, wherein the knee tracking logic comprises:

counter logic to determine the first gap based on a first count of clock cycles of a clock signal between the falling edge of the first comparison signal and the falling edge of the third comparison signal, and to determine the second gap based on a second count of clock cycles of the clock signal between the falling edge of the second comparison signal and the falling edge of the third comparison signal.

14. The controller of claim 12, further comprising gap accelerator logic configured to:

modify the generated error signal by:
  increasing a magnitude of the error signal responsive to the magnitude of the generated error signal being greater than a first threshold; and
  decreasing a magnitude of the error signal responsive to the magnitude of the generated error signal being lower than a second threshold, the second threshold lower than the first threshold;

generate a feedback signal based on the modified error signal;

adjust, based on the feedback signal, the first reference voltage, the second reference voltage, and the knee reference voltage; and using the feedback signal to regulate the output voltage of the switching power converter.

15. The controller of claim 12, further comprising a digital filter to determine a rate of change of the error signal between consecutive switching cycles, wherein the knee tracking logic is further configured to adjust the generated error signal based on the determined rate of change.

16. The controller of claim 12, further comprising:

a digital-to-analog converter to generate the first reference voltage, the second reference voltage, and the knee reference voltage based on the feedback voltage.

* * * * *

UNITED STATES PATENT AND TRADEMARK OFFICE
CERTIFICATE OF CORRECTION

PATENT NO. : 9,985,537 B2
APPLICATION NO. : 14/563954
DATED : May 29, 2018
INVENTOR(S) : Fuqiang Shi et al.

Page 1 of 1

It is certified that error appears in the above-identified patent and that said Letters Patent is hereby corrected as shown below:

On the Title Page

Column 1, Line 13, under Assignee (73), delete "Diaglo Semiconductor Inc." and insert --Dialog Semiconductor Inc.--

In the Claims

Claim 6, Column 12, Line 54, delete "being a first state" and insert --being in a first state--
Claim 6, Column 13, Line 8, delete "detect, by the" and insert --detecting, by the--
Claim 9, Column 13, Lines 37-38, delete "a first threshold; decreasing" and insert --a first threshold; and decreasing--

Signed and Sealed this
Twenty-seventh Day of November, 2018

Andrei Iancu
*Director of the United States Patent and Trademark Office*